(12) United States Patent
Kim et al.

(10) Patent No.: US 12,315,742 B2
(45) Date of Patent: May 27, 2025

(54) ELEMENT TRANSFERRING METHOD AND ELECTRONIC PANEL MANUFACTURING METHOD USING THE SAME

(71) Applicants: KOREA INSTITUTE OF MACHINERY & MATERIALS, Daejeon (KR); CENTER FOR ADVANCED META-MATERIALS, Daejeon (KR)

(72) Inventors: Jae-Hyun Kim, Daejeon (KR); Sejeong Won, Daejeon (KR); Hak Joo Lee, Daejeon (KR); Bongkyun Jang, Daejeon (KR); Hyeon-Don Kim, Daejeon (KR); Kwangseop Kim, Daejeon (KR); Sang Min Kim, Daejeon (KR)

(73) Assignees: KOREA INSTITUTE OF MACHINERY & MATERIALS, Daejeon (KR); CENTER FOR ADVANCED META-MATERIALS, Daejeon (KR)

( * ) Notice: Subject to any disclaimer, the term of this patent is extended or adjusted under 35 U.S.C. 154(b) by 475 days.

(21) Appl. No.: 17/778,537

(22) PCT Filed: Nov. 20, 2020

(86) PCT No.: PCT/KR2020/016532
§ 371 (c)(1),
(2) Date: May 20, 2022

(87) PCT Pub. No.: WO2021/101341
PCT Pub. Date: May 27, 2021

(65) Prior Publication Data
US 2023/0028998 A1 Jan. 26, 2023

(30) Foreign Application Priority Data
Nov. 22, 2019 (KR) .................. 10-2019-0151032

(51) Int. Cl.
*H01L 21/56* (2006.01)
*H01L 25/075* (2006.01)
(Continued)

(52) U.S. Cl.
CPC .......... *H01L 21/568* (2013.01); *H01L 21/561* (2013.01); *H01L 25/0753* (2013.01);
(Continued)

(58) Field of Classification Search
CPC . H01L 21/568; H01L 21/561; H01L 25/0753; H01L 27/15; H01L 33/52;
(Continued)

(56) References Cited

U.S. PATENT DOCUMENTS 6,919,508 B2 * 7/2005 Forcier ............... H01L 23/3128
257/E23.092
8,896,010 B2 * 11/2014 Tischler ................. H05B 33/10
257/98
(Continued)

FOREIGN PATENT DOCUMENTS

JP 2016-136613 7/2016
JP 2019-140380 8/2019
(Continued)

*Primary Examiner* — Vu A Vu
(74) *Attorney, Agent, or Firm* — LEX IP MEISTER, PLLC

(57) ABSTRACT

An embodiment of the present invention provides an element transferring method that may increase a yield of transferring an element, and an electronic panel manufacturing method using the same. The element transferring method includes: preparing a carrier film in which a first surface of an element on which a terminal is formed is adhered to an adhesive surface; providing a cover adhesive layer on the adhesive surface so that the second surface of the element that is opposite to the first surface and where the terminal is not formed is covered; transferring the element to
(Continued)

(a)

(b)

the target substrate by adhering the cover adhesive layer to the target substrate while the second surface is facing the target substrate; and separating the carrier film from the element, wherein in transferring the element, the carrier film is pressed so that the surface of the cover adhesive layer is flat at the same height as the terminal.

18 Claims, 11 Drawing Sheets

(51) Int. Cl.
*H10H 20/852* (2025.01)
*H10H 29/10* (2025.01)
*H10H 20/01* (2025.01)

(52) U.S. Cl.
CPC .......... *H10H 20/852* (2025.01); *H10H 29/10* (2025.01); *H10H 20/0362* (2025.01)

(58) Field of Classification Search
CPC ........... H01L 2933/005; H01L 21/6835; H01L 25/167; H01L 33/56; H01L 33/62; H01L 2221/68354; H01L 2221/68363; H01L 2221/68381; H01L 2933/0025; H01L 2933/0066; H01L 33/0095; H01L 21/324; H01L 21/78; H01L 21/52; H01L 24/26; H01L 27/156

USPC ......................................................... 438/107
See application file for complete search history.

(56) References Cited

U.S. PATENT DOCUMENTS

| | | | | |
|---|---|---|---|---|
| 9,391,051 | B2* | 7/2016 | Rhee | H01L 27/1248 |
| 9,831,222 | B2* | 11/2017 | Lee | H01L 33/20 |
| 10,037,949 | B1* | 7/2018 | Kim | H01L 23/552 |
| 10,083,944 | B2* | 9/2018 | Lee | H01L 33/007 |
| 10,636,937 | B2* | 4/2020 | Liao | H01L 33/62 |
| 11,315,802 | B2* | 4/2022 | Kim | H01L 24/14 |
| 12,033,909 | B2* | 7/2024 | Palm | H01L 21/568 |
| 2005/0233504 | A1* | 10/2005 | Doi | H01L 24/24 |
| | | | | 257/E25.02 |
| 2016/0163940 | A1* | 6/2016 | Huang | H01L 25/0756 |
| | | | | 257/89 |
| 2017/0033076 | A1* | 2/2017 | Morita | H01L 24/19 |
| 2017/0186719 | A1* | 6/2017 | Kira | H01L 21/563 |

FOREIGN PATENT DOCUMENTS

| | | |
|---|---|---|
| KR | 10-2018-0040770 | 4/2018 |
| KR | 10-2018-0112197 | 10/2018 |
| KR | 10-2019-0076690 | 7/2019 |
| KR | 10-2019-0120658 | 10/2019 |

* cited by examiner (a)

(b)

(a)

(b)

(a)

(b)

ELEMENT TRANSFERRING METHOD AND ELECTRONIC PANEL MANUFACTURING METHOD USING THE SAME

TECHNICAL FIELD

The present invention relates to an element transferring method and an electronic panel manufacturing method using the same. More particularly, the present invention relates to an element transferring method capable of increasing a yield of transferring an element and an electronic panel manufacturing method using the same.

BACKGROUND ART

Display using elements such as an LED is spotlighted as a next-generation high-tech display that will replace existing displays. In order to make such a display, a technology to transfer each LED element to a modularized circuit board is the key.

Large and thick elements may be transferred using a vacuum chuck, but in a case of micro devices with a thickness of 20 μm or less, the element may be damaged due to a pressure generated by the vacuum chuck, so it is difficult to use the vacuum chuck.

As another method, there is a method of transferring the element by using an electrostatic chuck technology, but the thin elements, such as micro LEDs that are vulnerable to static electricity can be damaged, and there is a drawback that a large area transferring is difficult.

For the above reasons, for the element in the form of a thin film with a very thin thickness, a transfer technology using a van der Waals adhesive force of the polymer stamp is widely used.

In general, in the method of transferring the element by using the van der Waals adhesive force, the element array arranged on the source substrate is adhered to the carrier film and then transferred to the target substrate with or without interconnection materials.

In the picking process of transferring the elements on the source substrate to the carrier film, the adhesive force between the carrier film and the element must be managed to be greater than the adhesive force between the source substrate and the element. And, in the placing process of transferring the element adhered to the carrier film to the target substrate, the adhesive force between the carrier film and the element must be managed to be smaller than the adhesive force between the target substrate and the element.

However, it is difficult to form the greater adhesive force between the solder and the element in the placing process than the adhesive force between the element and the carrier film in the placing process, and accordingly, the element adhered to the carrier film may not be stably transferred to the target substrate, so there is a problem in that the transfer yield is deteriorated.

DISCLOSURE

Technical Problem

In order to solve the above problem, the technical object to be achieved by the present invention is to provide an element transferring method that may increase the yield of transferring the element and an electronic panel manufacturing method using the same.

The technical object aimed to be achieved by the present invention is not limited to the foregoing technical object, and other non-mentioned technical objects may be clearly understood by those skilled in the art from the description below.

Technical Solution

To achieve a technical object, an embodiment of the present invention is to provide an element transferring method including preparing a carrier film in which a first surface of an element on which a terminal is formed is adhered to an adhesive surface; providing a cover adhesive layer on the adhesive surface so that a second surface of the element that is opposite to the first surface and where the terminal is not formed is covered; transferring the element to a target substrate by adhering the cover adhesive layer to the target substrate while the second surface is facing the target substrate; and separating the carrier film from the element, wherein in the element transferring step, the carrier film is pressed so that the surface of the cover adhesive layer is flat at the same height as the terminal.

In an embodiment of the present invention, in providing the cover adhesive layer, the cover adhesive layer may be formed into a second gel state having a second hardness degree greater than a first hardness degree by being pre-baked after a cover adhesive material of a first gel state having the first hardness degree is prepared to cover the element.

In an embodiment of the present invention, after transferring the element, solidifying the cover adhesive material into a solid having a third hardness degree greater than the second hardness degree through a post-baking may be included.

On the other hand, in order to achieve the technical object, an electronic panel manufacturing method using an element transferring method according to an embodiment of the present invention includes providing a metal wiring that electrically connects the terminal to a flat surface of a hardened adhesive layer where the carrier film is separated and exposed after the cover adhesive layer is formed into the hardened adhesive layer in a solid; and providing a protection layer to cover the metal wiring on the first surface of the element.

An element transferring method according to an embodiment of the present invention includes preparing a carrier film in which a first surface of an element on which a terminal is formed is adhered to an adhesive surface; providing a cover adhesive layer on the adhesive surface so that the second surface of the element that is opposite to the first surface and where the terminal is not formed is covered; forming a base adhesive layer on one surface of the target substrate; transferring the element to the base adhesive layer by attaching the cover adhesive layer to the base adhesive layer while the second surface faces the base adhesive layer; and separating the carrier film from the element, in transferring the element, the carrier film is pressed so that the surface of the cover adhesive layer is flat at the same height as the terminal.

In an embodiment of the present invention, in providing the cover adhesive layer, the cover adhesive layer may be formed into a second gel state having a second hardness degree greater than a first hardness degree by being pre-baked after the cover adhesive material of a first gel state having the first hardness degree is prepared to cover the element, and in the base adhesive layer forming, the base adhesive layer may be formed of the base adhesive material of the first gel state.

In an embodiment of the present invention, after transferring the element, post-baking the base adhesive material and the cover adhesive material to be integrated into a solid having a third hardness degree of greater than the second hardness degree may be included.

In an embodiment of the present invention, after the carrier film is separated from the element, the cover adhesive layer may have a flat surface formed flat to the same height as the terminal.

On the other hand, an electronic panel manufacturing method using an element transferring method according to an embodiment of the present invention includes providing metal wiring that electrically connects the terminal to a flat surface of a hardened adhesive layer where the carrier film is separated and exposed after the cover adhesive layer and the base adhesive layer are formed into the hardened adhesive layer in a solid; and providing a protection layer to cover the metal wiring on the first surface of the element.

An element transferring method according to an embodiment of the present invention includes: preparing a carrier film in which a first surface of an element on which a terminal is formed is adhered to an adhesive surface; weakening an adhesive force between the element and the adhesive surface; forming a base adhesive layer on one surface of the target substrate; transferring the element to the base adhesive layer by adhering the adhesive surface to the base adhesive layer in the state that a second surface of the element, which is opposite to the first surface and where the terminal is not formed, faces the base adhesive layer; and separating the carrier film from the element, and in transferring the element, the carrier film is pressed so that the surface of the cover adhesive layer is flat at the same height as the terminal.

In an embodiment of the present invention, in forming the base adhesive layer, the base adhesive layer may be formed of a base adhesive material of a first gel state having a first hardness degree, and in transferring the element, the element may be inserted into the base adhesive material, and the base adhesive material may be baked to a solid having a third hardness degree that is greater than the first hardness degree to fix the element.

In an embodiment of the present invention, after the carrier film is separated from the element, the base adhesive layer may have a flat surface formed to the same height as the terminal.

An electronic panel manufacturing method using an element transferring method according to an embodiment of the present invention includes providing metal wiring that electrically connects the terminal to a flat surface of a hardened adhesive layer where the carrier film is separated and exposed after the base adhesive layer is formed into the hardened adhesive layer in a solid, and providing a protection layer to cover the metal wiring on the first surface of the element.

In an embodiment of the present invention, after providing the protection layer, separating the target substrate from the hardened adhesive layer and attaching a flexible substrate to the hardened adhesive layer may be further included.

In an embodiment of the present invention, the target substrate may be separated from the hardened adhesive layer by a laser lift-off (LLO) method.

Advantageous Effects

According to an embodiment of the present invention, the element transferred to the target substrate is inserted into the hardened adhesive layer. Therefore, even if the carrier film is separated from the element, the element may be prevented from being separated from the target substrate along with the carrier film. That is, since only the carrier film may be easily separated while the element is transferred to the target substrate, the transfer yield may be improved.

In addition, according to an embodiment of the present invention, since the hardened adhesive layer is formed flat and the metal wiring may be formed on the terminal exposed to the outside, the process may be easy and the yield of the electronic panel manufacturing process may be improved, and the thickness of the electronic panel may be also be reduced.

The effects of the present invention are not limited to the foregoing effects, and it shall be understood that the effect of the present invention includes all of the effects inferable from the detailed description of the present invention or the configuration of the invention described in the claims.

MODE FOR INVENTION

Figure 1:
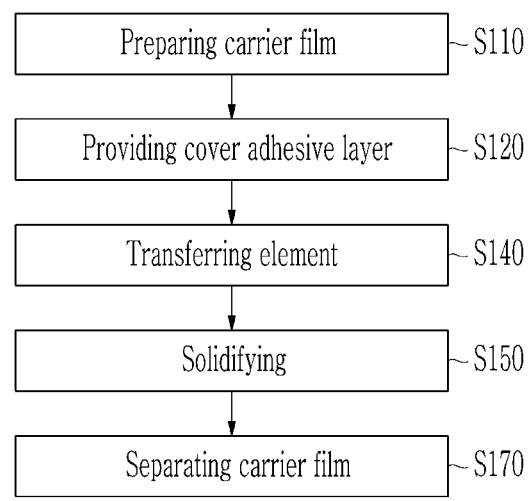
FIG. 1 is a flowchart showing an element transferring method according to a first embodiment of the present invention.

Hereinafter, the present invention will be described with reference to the accompanying drawings. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, when it is described that a part is "connected (in contact with, coupled)" to another part, the part may be "directly connected" to the other element or "connected" to the other part through a third part. Unless explicitly described to the contrary, the word "comprise" and variations such as "comprises" or "comprising"

will be understood to imply the inclusion of stated elements but not the exclusion of any other elements.

Further, terms used in the present specification are used for simply explaining a specific embodiment, and are not intended to limit the present invention. A singular expression includes a plural expression unless it is specifically described to the contrary in the context. It will be appreciated that terms "including" and "having" are intended to designate the existence of characteristics, numbers, steps, operations, constituent elements, and components described in the specification, or a combination thereof, and do not exclude a possibility of the existence or addition of one or more other characteristics, numbers, steps, operations, constituent elements, components, or a combination thereof in advance.

Hereinafter, embodiments of the present invention will be described in detail with reference to the accompanying drawings.

Figure 2:
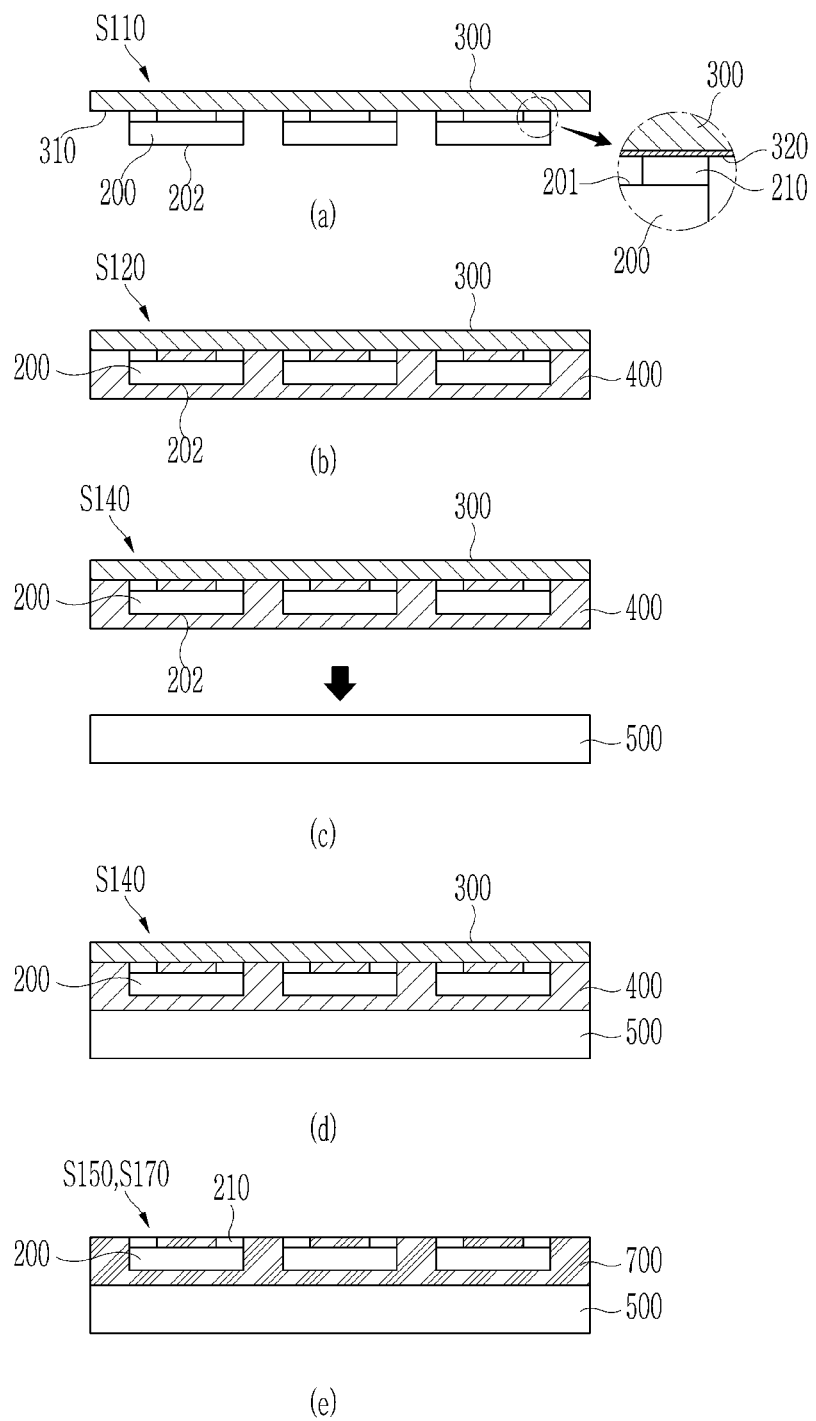
FIG. 2 is a view showing a process according to an element transferring method of FIG. 1.

FIG. 1 is a flowchart showing an element transferring method according to a first embodiment of the present invention, and FIG. 2 is a view showing a process according to an element transferring method of FIG. 1.

As shown in FIG. 1 and FIG. 2, the element transferring method according to the present embodiment may include a step of preparing a carrier film (S110), a step of providing a cover adhesive layer (S120), a step of transferring an element (S140) and a step of separating a carrier film (S170).

The step of preparing the carrier film (S110) may be a step of preparing a carrier film 300 that a first surface 201 of an element 200 formed with a terminal 210 is adhered to an adhesive surface 310.

The element 200 may be in a state that is adhered to the carrier film 300 in an arrangement having a pitch that matches the arrangement to be finally transferred to the target substrate 500.

The element 200 may be a light-emitting element such as an LED, but is not limited thereto, and may be extended to a circuit element having an electronic circuit.

The carrier film 300 may have a separate adhesive layer 320 having adhesiveness as shown, but it is not limited thereto, and the carrier film 300 itself may be made of a material having adhesiveness.

A terminal 210 may be provided on the first surface 201 of the element 200, and the terminal 210 may be adhered to the adhesive surface 310 of the carrier film 300. In the terminal 210, the second surface 202 that is the opposite side of the first surface 201 and where the terminal 210 is not formed may face the opposite direction of the carrier film 300.

The step of preparing the cover adhesive layer (S120) may be a step of preparing a cover adhesive layer 400 on the adhesive surface 310 of the carrier film 300 to cover the second surface 202.

The cover adhesive layer 400 may be made of a cover adhesive material, and the cover adhesive material may be in a first gel state having a first hardness degree.

The cover adhesive layer 400 may be formed by coating a cover adhesive material through a coating process such as spin coating, bar coating, or drop dispensing. The cover adhesive layer 400 may be formed to be thicker than the element 200, and accordingly, the cover adhesive layer 400 may be formed to completely cover the second surface 202 of the element 200.

Before the cover adhesive layer 400 is provided, a polymer coating layer may be further provided on the adhesive surface 310 of the carrier film 300. The polymer coating layer may be formed to the thickness of several tens of nm by depositing a polymer in a vapor state on the adhesive surface 310.

For the uniform coating of the polymer coating layer, a plasma treatment process for the polymer coating layer may be further added during the polymer coating layer process. When the cover adhesive material is coated to the polymer coating layer thus formed, the cover adhesive material may be formed more uniformly, so that the cover adhesive layer 400 having the uniform thickness may be prepared.

Also, in the step of preparing the cover adhesive layer (S120), to improve the surface adherence between the cover adhesive material and the element 200, an element surface treatment process for treating the surface of the element 200 may be further performed.

In the element surface treatment process, hexamethyldisilazane (HMDS) may be coated on the surface of the element 200.

The cover adhesive layer 400 made of the cover adhesive material in the first gel state may flow down by gravity. Therefore, in order to prevent this, in the step of preparing the cover adhesive layer (S120), after the cover adhesive material is prepared to cover the entire element 200, the cover adhesive material is pre-baked to have a second hardness degree greater than the first hardness degree, thereby being formed in a gel state. The cover adhesive layer 400 of the second gel state may maintain a shape thereof. The method of the pre-baking may use irradiating ultraviolet rays or raising a temperature, but it is not limited to these two methods, and any method that changes the hardness of the cover adhesive material may be used.

The cover adhesive material may be an optically clear adhesive (OCA), and may have a viscosity of 3000 to 47,000 cPs at 25° C.

The step of transferring the element (S140) may be a step of transferring the element 200 to the target substrate 500.

In the step of transferring the element (S140), the cover adhesive layer 400 may be adhered to the target substrate 500 while the second surface 202 of the element 200 faces the target substrate 500.

Also, in the step of transferring the element (S140), a process of pressing the carrier film 300 so that the surface of the cover adhesive layer 400 is flat at the same height as the terminal 210 of the element 200 may be further performed.

Figure 3:
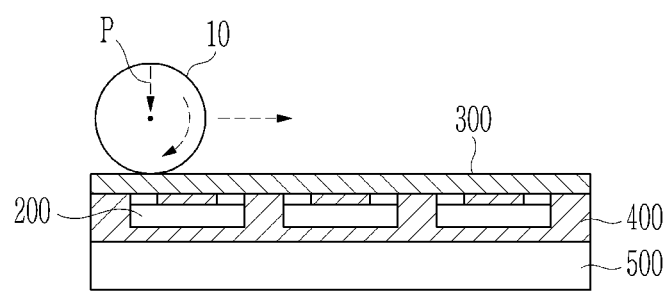
FIG. 3 is a view for explaining a process of pressing a cover adhesive layer in an element transferring step of an element transferring method of FIG. 1.
Figure 3:
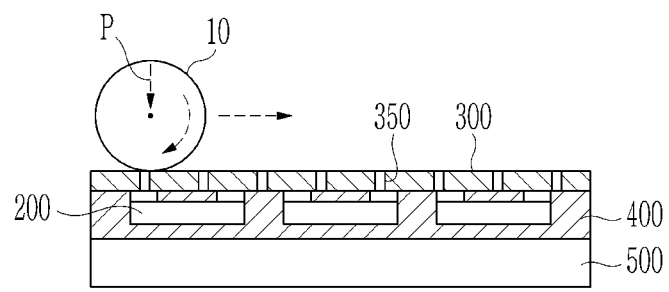

FIG. 3 is a view for explaining a process of pressing a cover adhesive layer in an element transferring step of an element transferring method of FIG. 1.

First, as shown in FIG. 3 (a), the carrier film 300 may be pressed by a roller 10. The load P applied to the carrier film 300 by the roller 10 may be 200 KPa or less.

The roller 10 may press the carrier film 300 as a whole while simultaneously rotating and applying the load P to the carrier film 300. At this time, it is preferable that the roller 10 presses the carrier film 300 while sequentially moving from one side of the carrier film 300 to the other direction so that air bubbles of the cover adhesive material may be well discharged. Through this process, the cover adhesive layer 400 may be pressed, and the surface of the cover adhesive layer 400 may be flattened at the same height as the terminal 210.

On the other hand, as shown in FIG. 3 (b), a plurality of through-holes 350 may be further formed in the carrier film 300 to effectively discharge the air bubbles.

Again, referring to FIG. 1 and FIG. 2, the element transferring method may include a solidifying step (S150).

The solidifying step (S150) may be performed after the step of transferring the element (S140). The solidifying step (S150) may be a step of changing the cover adhesive material into a solid state having a third hardness degree greater than a second hardness degree by post-baking.

When the cover adhesive material is post-baked through the solidifying step (S150), the cover adhesive material is solidified to become a hardened adhesive layer 700 in a solid having a third hardness degree, and the hardened adhesive layer 700 may also be firmly combined with the target substrate 500 in the state accommodating the element 200 inside.

The step of separating the carrier film (S170) may be a step of separating the carrier film 300 from the element 200. In the carrier film separation step, when the carrier film 300 is separated from the element 200, the hardened cover adhesive layer 400, specifically the hardened adhesive layer 700, may have a flat surface formed flat to the same height as the terminal 210. The formation of the flat layer of the same height as the terminal 210 of the element 200 on the hardened adhesive layer 700 is a very important merit in the process of depositing metal wiring or forming a transistor for the electric connection with the terminal 210 thereafter.

The element 200 may be an LED element, and the cover adhesive layer 400 and the target substrate 500 may have optical transparency, and through this, the light emitted from the second surface 202 of the element 200 may be emitted to penetrate through the hardened adhesive layer 700 and the target substrate 500.

According to the present embodiment, in the placing process, the cover adhesive layer 400 is post-baked and integrated. Therefore, even if the carrier film 300 is separated from the element 200, the element 200 may be prevented that from adhering to the carrier film 300 and being separated from the target substrate 500 along the carrier film 300. That is, since only the carrier film 300 may be easily separated while the element 200 is transferred to the target substrate 500, the transferring yield may be improved.

Figure 4:
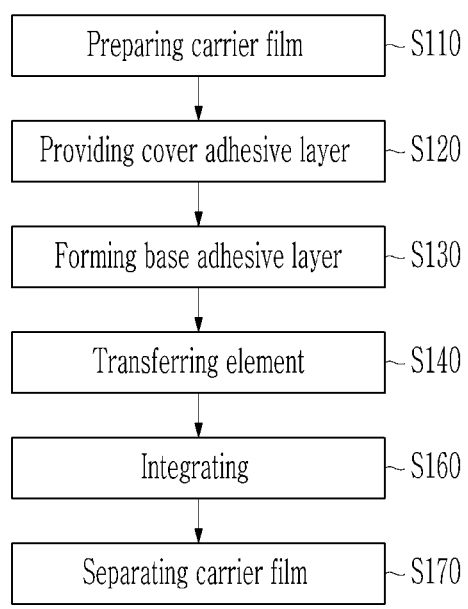
FIG. 4 is a flowchart showing an element transferring method according to a second embodiment of the present invention.
Figure 5:
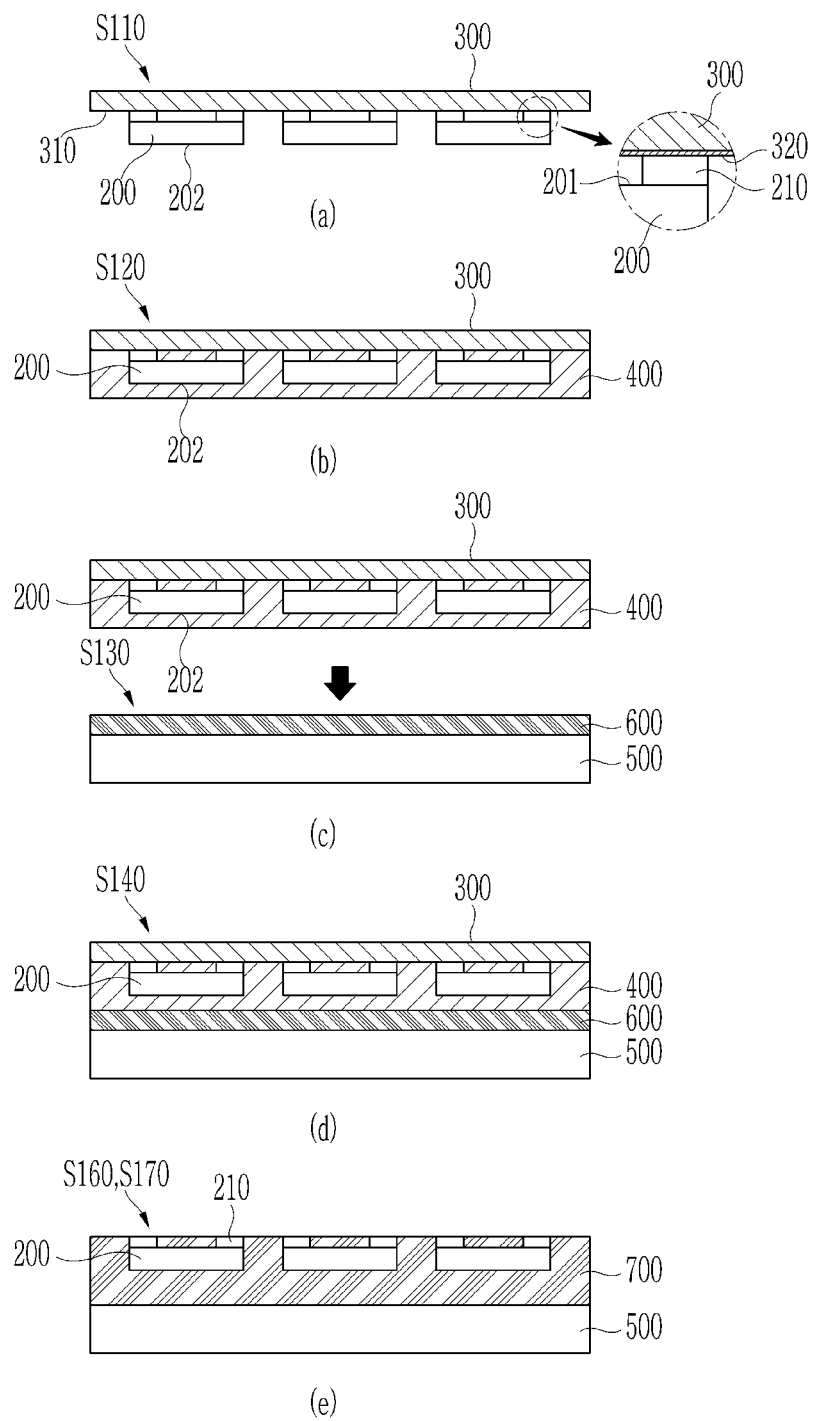
FIG. 5 is a view showing a process according to an element transferring method of FIG. 4.

FIG. 4 is a flowchart showing an element transferring method according to a second embodiment of the present invention, and FIG. 5 is a view showing a process according to an element transferring method of FIG. 4.

As shown in FIG. 4 and FIG. 5, the element transferring method according to the present embodiment may include a step of preparing a carrier film (S110), a step of providing a cover adhesive layer (S120), a step of forming a base adhesive layer (S130), a step of transferring an element (S140), and a step of separating the carrier film (S170).

The step of preparing the carrier film (S110) and the step of providing the cover adhesive layer (S120) may be the same as the step of preparing the carrier film (S110) and the step of providing the cover adhesive layer (S120) of the first embodiment above-described.

The step of forming the base adhesive layer (S130) may be a step of forming a base adhesive layer on one surface of the target substrate.

In the step of forming the base adhesive layer (S130), the base adhesive layer 600 may be formed of a base adhesive material of a first gel state having a first hardness degree. The base adhesive layer 600 may also be formed through a coating process such as spin coating, bar coating, or drop dispensing. The basic adhesive material may be the same as the cover adhesive material.

Although the base adhesive layer 600 is in the first gel state, the shape thereof may be maintained because it is provided on the target substrate 500.

The step of transferring the element (S140) may be a step of transferring the element 200 to the base adhesive layer 600.

In the step of transferring the element (S140), the cover adhesive layer 400 may be adhered to the base adhesive layer 600 while the second surface 202 of the element 200 faces the base adhesive layer 600. In detail, in the step of transferring the element (S140), the second surface 202 of the element 200, which is the opposite side of the first surface 201 and does not have the terminal 210, may be transferred in a state facing the target substrate 500.

Also, in the step of transferring the element (S140), a process of pressing the carrier film 300 so that the surface of the cover adhesive layer 400 is flat at the same height as the terminal 210 of the element 200 may be further performed.

Figure 6:
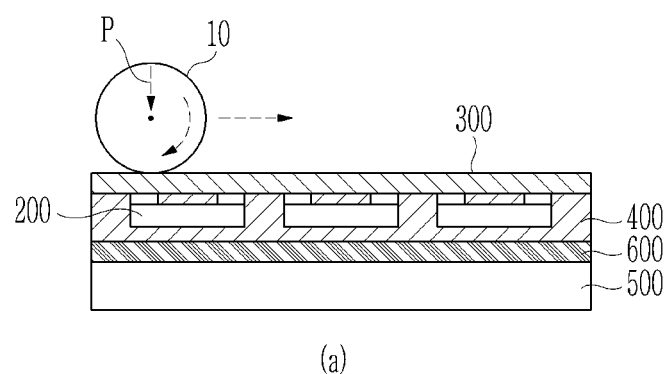
FIG. 6 is a view for explaining a process of pressing a cover adhesive layer in an element transferring step of an element transferring method of FIG. 4.
Figure 6:
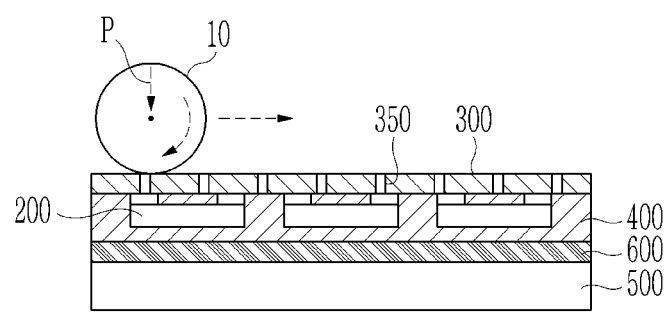

FIG. 6 is a view for explaining a process of pressing a cover adhesive layer in an element transferring step of an element transferring method of FIG. 4.

As shown in FIG. 6 (a), by pressing the carrier film 300 with the roller 10, the cover adhesive layer 400 and the base adhesive layer 600 may be pressed, and through this, the surface of the cover adhesive layer 400 may be formed flat at the same height as the terminal 210. Also, as shown in FIG. 6 (b), a plurality of through-holes 350 are further formed in the carrier film 300 to increase the efficiency of discharging air bubbles.

Further, the element transferring method may include an integration step (S160).

The integration step (S160) may be performed after the step of transferring the element (S140). The integration step (S160) may be a step of post-baking the base adhesive material and the cover adhesive material to be integrated into a solid having the third hardness degree that is greater than the second hardness degree.

If the base adhesive material and the cover adhesive material are post-baked through the integration step (S160), the base adhesive material and the cover adhesive material may be integrated into the hardened adhesive layer 700 in a solid having the third hardness degree, and the hardened adhesive layer 700 may be also tightly coupled with the target substrate 500 while the element 200 is accommodated there inside.

The step of separating the carrier film S170 may be a step of separating the carrier film 300 from the element 200. The step of separating the carrier film S170 may be the same as the step of separating the carrier film S170 of the first embodiment described above.

In the carrier film separation step, when the carrier film 300 is separated from the element 200, the hardened cover adhesive layer 400, specifically the hardened adhesive layer 700, may have a flat surface formed flat to the same height as the terminal 210. The formation of the flat layer of the same height as the terminal 210 of the element 200 on the hardened adhesive layer 700 is a very important merit in the process of depositing metal wiring or forming a transistor for the electrical connection with the terminal 210 thereafter.

The element 200 may be an LED the element, and the base adhesive layer 600, the cover adhesive layer 400, and the target substrate 500 may have optical transparency, so that the light emitted from the second surface 202 of the element 200 may be emitted to penetrate through the hardened adhesive layer 700 and the target substrate 500.

According to the present embodiment, in the placing process, the cover adhesive layer 400 and the base adhesive layer 600 are post-baked and integrated. Therefore, even if the carrier film 300 is separated from the element 200, the element 200 may be prevented from being adhered to the carrier film 300 and is separated from the target substrate 500 along with the carrier film 300. That is, since only the carrier film 300 may be easily separated while the element 200 is transferred to the target substrate 500, the transferring yield may be improved.

Figure 7:
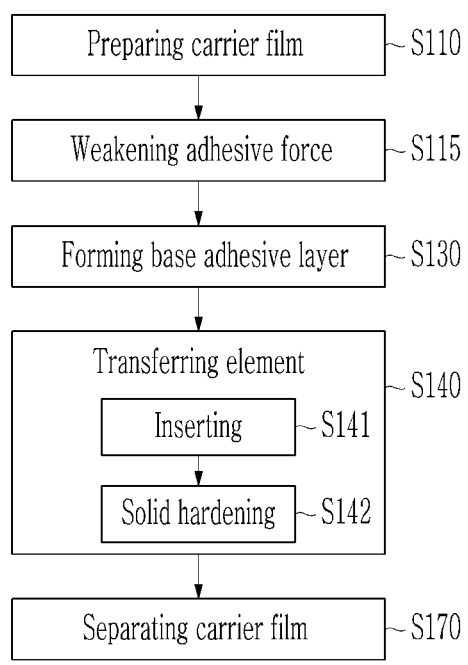
FIG. 7 is flowchart showing an element transferring method according to a third embodiment of the present invention.
Figure 8:
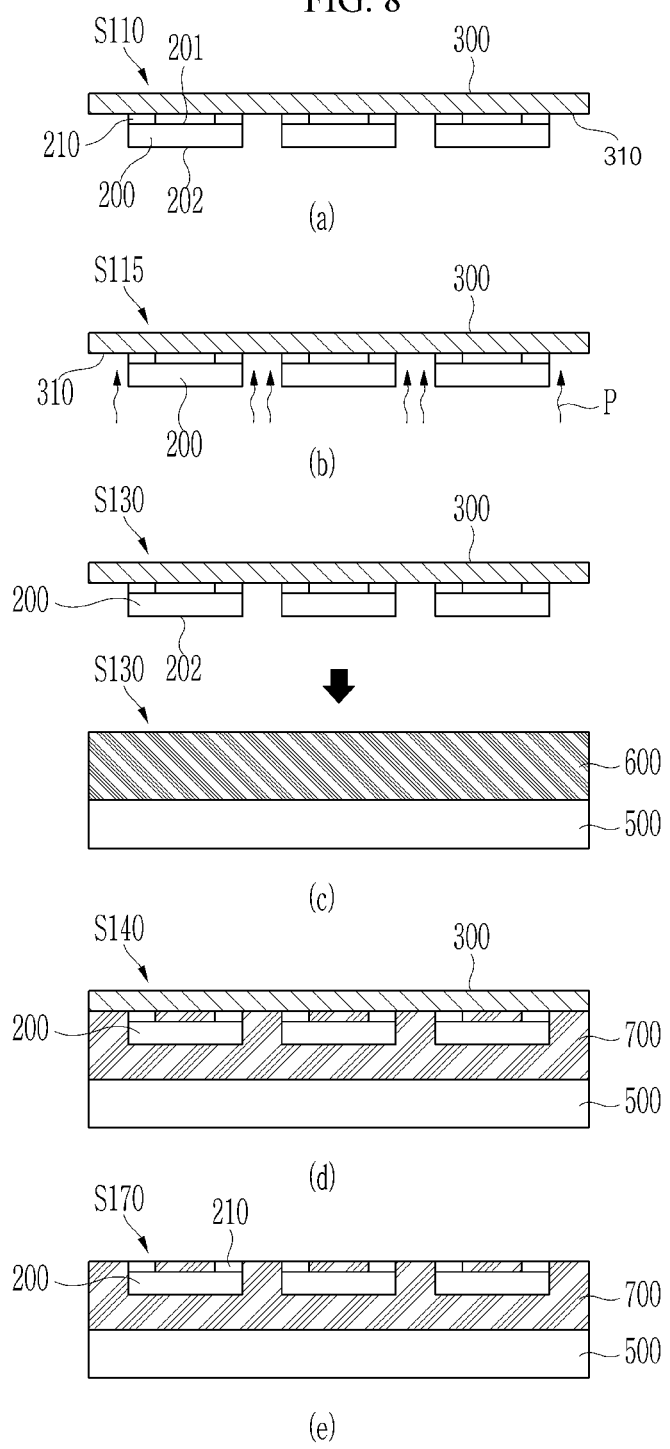
FIG. 8 is a view showing a process according to an element transferring method of FIG. 7.

FIG. 7 is a flowchart showing an element transferring method according to a third embodiment of the present invention, and FIG. 8 is a view showing a process according to an element transferring method of FIG. 7.

As shown in FIG. 7 and FIG. 8, the element transferring method according to the present embodiment may include the step of preparing the carrier film (S110), a step of weakening/treating an adhesive force (S115), a step of forming the base adhesive layer (S130), the step of transferring the element (S140), and a step of separating the carrier film (S170).

The step of preparing the carrier film (S110) is the same as the step of preparing the carrier film (S110) described in the above-described first embodiment.

In the step of weakening processing the adhesive force (S115), the adhesive surface 310 may be treated to weaken the adhesive force of the adhesive surface 310.

As a method to weaken the adhesive force of the adhesive surface 310, a method of weakening the adhesive force between the element 200 and the adhesive surface 310 by treating the adhesive surface 310 with plasma (P) to form a nanoscale oxide layer on the adhesive surface 310 may be used.

The plasma treatment may not affect the carrier film 300 to maintain the arrangement of the element 200, and the plasma used in this case may be oxygen plasma.

In addition, as a method for weakening the adhesive force of the adhesive surface 310, a hydrophobic self-assembled monolayer (SAM) treatment method or a Teflon coating method may be used.

The step of forming the base adhesive layer (S130) may be the same as the step of forming the base adhesive layer (S130) described in the above-described second embodiment. However, in the present embodiment, the base adhesive layer 600 formed in the step of forming the base adhesive layer (S130) may be high enough for all parts of the element 200 in the step of transferring the element (S140) to be embedded in the base adhesive layer 600. That is, the base adhesive layer 600 in the present embodiment may be formed with the height adding the height of the base adhesive layer 600 and the height of the cover adhesive layer 400 in the second embodiment.

The step of transferring the element (S140) may be a step of transferring the element 200 to the base adhesive layer 600 to by adhering the adhesive surface 310 to the base adhesive layer 600 while the second surface 202 of the element 200 faces the base adhesive layer 600.

The step of transferring the element (S140) may have an insertion step (S141) and a solid hardening step (S142).

The insertion step (S141) may be a step in which the element 200 is inserted into the base adhesive material. In the insertion step (S141), the entire element 200 may be buried in the base adhesive layer 600.

After the insertion step (S141), a process of pressing the carrier film 300 so that the surface of the base adhesive layer 600 is flat at the same height as the terminal 210 of the element 200 may be further performed.

Figure 9:
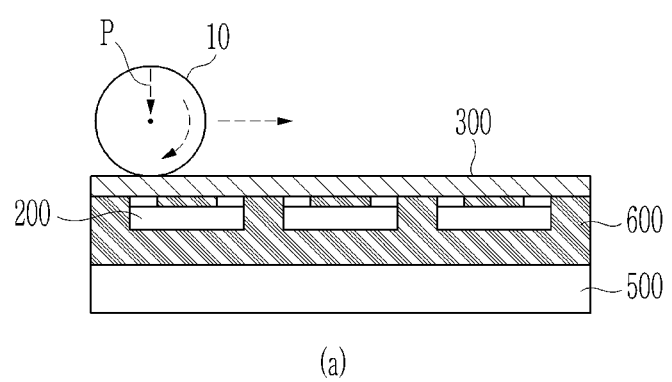
FIG. 9 is a view for explaining a process of pressing a base adhesive layer in an element transferring step of an element transferring method of FIG. 7.
Figure 9:
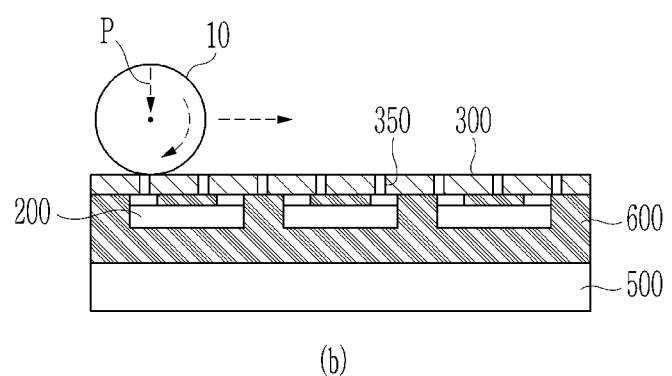

FIG. 9 is a view for explaining the process of pressing a base adhesive layer in an element transferring step of an element transferring method of FIG. 7.

As shown in FIG. 9 (a), by pressing the carrier film 300 with the roller 10, the base adhesive layer 600 may be pressed, and through this, the surface of the base adhesive layer 600 may be flattened at the same height as the terminal 210. As shown in FIG. 9 (b), a plurality of through-holes 350 are further formed in the carrier film 300 to increase the efficiency of discharging air bubbles.

The solid hardening step (S142) may be a step of fixing the element 200 by baking the base adhesive material to a solid having a third hardness degree that is greater than the first hardness degree.

When the base adhesive layer 600 is baked through the solid hardening step (S142), the base adhesive layer 600 may become the hardened adhesive layer 700, and the hardened adhesive layer 700 may also be tightly coupled with the target substrate 500 while receiving the element 200 inside.

The step of separating the carrier film (S170) may be a step of separating the carrier film 300 from the element 200. In the carrier film separation step, when the carrier film 300 is separated from the element 200, the hardened base adhesive layer 600, specifically the hardened adhesive layer 700, may have a flat surface formed flat to the same height as the terminal 210.

The element 200 may be an LED element, and the base adhesive layer 600 and the target substrate 500 may have optical transparency, and through this, the light emitted from the second surface 202 of the element 200 may be emitted while penetrating through the hardened adhesive layer 700 and the target substrate 500.

Even according to the present embodiment, when the carrier film 300 is separated from the element 200, it may be prevented that the element 200 is adhered to the carrier film 300 and is separated from the target substrate 500, so the transfer yield may be improved.

Figure 10:
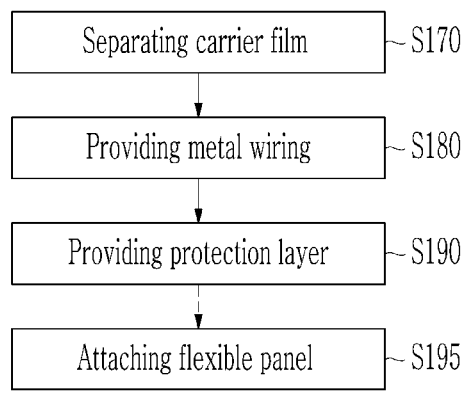
FIG. 10 is a flowchart showing an electronic panel manufacturing method according to an embodiment of the present invention.
Figure 11:
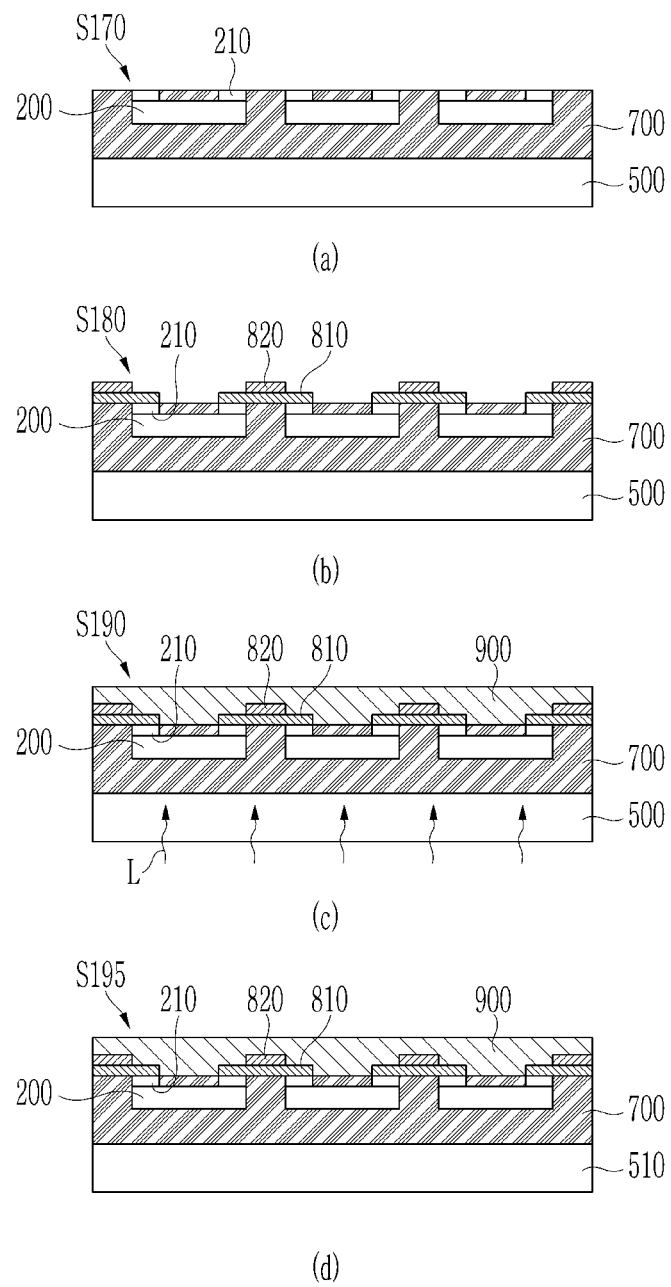
FIG. 11 is a diagram showing a process according to an electronic panel manufacturing method of FIG. 10.

FIG. 10 is a flowchart showing an electronic panel manufacturing method according to an embodiment of the present invention, and FIG. 11 is an example diagram showing a process according to an electronic panel manufacturing method of FIG. 10.

As shown in FIG. 10 and FIG. 11, the electronic panel manufacturing method may use the element transferring method described above.

The electronic panel manufacturing method may include a step of providing metal wiring (S180) and a step of providing a protection layer (S190).

The step of providing the metal wiring (S180) may be performed after the step of separating the carrier film (S170). The step of providing the metal wiring (S180) may be a step of providing a metal wiring 810 electrically connected to the terminal 210 of the element 200 that is exposed to the outside after the carrier film is separated.

Providing the metal wiring 810 in the step of providing the metal wiring (S180) may mean performing a patterning process for depositing the transistor 820 as well as the metal wiring 810. The transistor 820 may include a thin film transistor (TFT).

According to the present embodiment, as the hardened adhesive layer 700 has the flat surface formed flat at the same height as the terminal 210 of the element 200, because the metal wiring 810 may be provided directly to the terminal 210 exposed to the outside, the process of preparing the metal wiring is easy, so the yield of the electronic panel manufacturing process may be improved. In addition, since the metal wiring 810 is formed on the terminal 210 exposed to the outside, the thickness of the electronic panel may be reduced.

The step of providing the protection layer (S190) may be a step of providing a protection layer 900 to cover the metal wiring 810 on the first surface 201 of the element 200. The protection layer 900 may be made of epoxy, silicone, or acryl-based polymer material.

The electronic panel manufacturing method may further include a flexible substrate attaching step (S195).

The flexible substrate attaching step (S195) may be performed after the protection layer providing step. The flexible substrate attachment step S195 may be a step of separating the target substrate 500 from the hardened adhesive layer 700 formed by baking the base adhesive layer, and attaching the flexible substrate 510 to the hardened adhesive layer 700.

The target substrate 500 may be separated from the hardened adhesive layer 700 by a laser lift-off (LLO) method using a laser (L).

When the flexible substrate 510 is attached, the electronic panel manufactured by the electronic panel manufacturing method may become a flexible electronic panel with flexibility.

The description of the present invention is merely illustrative, and it will be understood by those skilled in the art that various changes in a specific form and details may be made therein without a change of the technical spirit or essential features of the present invention. Accordingly, it shall be understood that the embodiments described above are illustrative in all aspects, and are not limited. For example, each constituent element described in a singular form may be distributed and fed, and similarly, constituent elements described as being distributed may be fed in a combined form.

The scope of the present invention is represented by the claims, and it shall be construed that all of the changes or modified forms derived from the meaning and the scope of the claims and equivalent concepts thereof are included in the scope of the present invention.

| (Description of symbols) |
| --- |
| 200: element |
| 201: first surface |
| 202: second surface |
| 210: terminal |
| 300: carrier film |
| 400: cover adhesive layer |
| 500: target substrate |
| 510: flexible substrate |
| 600: base adhesive layer |
| 700: hardened adhesive layer |
| 810: metal wiring |
| 820: transistor |
| 900: protection layer |

The invention claimed is:

1. An element transferring method comprising:
preparing a carrier film in which a first surface of an element on which a terminal is formed is adhered to an adhesive surface;
providing a cover adhesive layer on the adhesive surface so that a second surface of the element that is opposite to the first surface and where the terminal is not formed is covered;
transferring the element to a target substrate by adhering the cover adhesive layer to the target substrate while the second surface is facing the target substrate; and
separating the carrier film from the element,
wherein in transferring the element, after transferring the element to the target substrate by adhering the cover adhesive layer to the target substrate, an opposite surface of the adhesive surface of the carrier film is pressed so that the surface of the cover adhesive layer is flat at the same height as the terminal.

2. The element transferring method of claim 1, wherein in providing the cover adhesive layer, the cover adhesive layer is formed into a second gel state having a second hardness degree that is greater than a first hardness degree by being pre-baked after a cover adhesive material of a first gel state having the first hardness degree is prepared to cover the element.

3. The element transferring method of claim 2, further comprising
after transferring the element, solidifying the cover adhesive material into a solid having a third hardness degree that is greater than the second hardness degree through a post-baking.

4. An electronic panel manufacturing method using an element transferring method of claim 1, comprising:
providing metal wiring electrically connected to the terminal on a flat surface of a hardened adhesive layer where the carrier film is separated and exposed after the cover adhesive layer is formed into the hardened adhesive layer in a solid; and
providing a protection layer to cover the metal wiring on the first surface of the element.

5. The element transferring method of claim 1, wherein after the carrier film is separated from the element, the cover adhesive layer has a flat surface formed flat to the same height as the terminal.

6. An element transferring method comprising:
preparing a carrier film in which a first surface of an element on which a terminal is formed is adhered to an adhesive surface;
providing a cover adhesive layer on the adhesive surface so that a second surface of the element that is opposite to the first surface and where the terminal is not formed is covered;
forming a base adhesive layer on one surface of a target substrate;
transferring the element to the base adhesive layer by attaching the cover adhesive layer to the base adhesive layer while the second surface faces the base adhesive layer; and
separating the carrier film from the element,
wherein in transferring the element, after transferring the element to the target substrate by adhering the cover adhesive layer to the target substrate, an opposite surface of the adhesive surface of the carrier film is pressed so that the surface of the cover adhesive layer is flat at the same height as the terminal.

7. The element transferring method of claim 6, wherein in providing the cover adhesive layer, the cover adhesive layer is formed into a second gel state having a second hardness degree that is greater than a first hardness degree by being pre-baked after a cover adhesive material of a first gel state having the first hardness degree is prepared to cover the element, and
in the forming of the base adhesive layer, the base adhesive layer is formed of a base adhesive material of the first gel state.

8. The element transferring method of claim 7, further comprising,
after transferring the element, post-baking the base adhesive material and the cover adhesive material to be integrated into a solid having a third hardness degree that is greater than the second hardness degree.

9. The element transferring method of claim 6, wherein after the carrier film is separated from the element, the cover adhesive layer has a flat surface formed flat to the same height as the terminal.

10. An electronic panel manufacturing method using an element transferring method of claim 6, comprising:
providing metal wiring electrically connected to the terminal on a flat surface of a hardened adhesive layer where the carrier film is separated and exposed after the cover adhesive layer and the base adhesive layer are formed into the hardened adhesive layer in a solid; and
providing a protection layer to cover the metal wiring on the first surface of the element.

11. An element transferring method comprising:
preparing a carrier film in which a first surface of an element on which a terminal is formed is adhered to an adhesive surface;
weakening an adhesive force between the element and the adhesive surface;
forming a base adhesive layer on one surface of a target substrate;
transferring the element to the base adhesive layer by adhering the adhesive surface to the base adhesive layer in a state that a second surface of the element, which is opposite to the first surface and where the terminal is not formed, faces the base adhesive layer; and
separating the carrier film from the element,
wherein in transferring the element, after transferring the element to the target substrate by adhering the cover adhesive layer to the target substrate, an opposite surface of the adhesive surface of the carrier film is pressed so that the surface of the base adhesive layer is flat at the same height as the terminal.

12. The element transferring method of claim 11, wherein
in forming the base adhesive layer, the base adhesive layer is formed of a base adhesive material of a first gel state having a first hardness degree,
and in transferring the element,
the element is inserted into the base adhesive material, and
the base adhesive material is baked to a solid having a third hardness degree that is greater than the first hardness degree to fix the element.

13. The element transferring method of claim 11, wherein after the carrier film is separated from the element, the base adhesive layer has a flat surface formed flat to the same height as the terminal.

14. An electronic panel manufacturing method using an element transferring method of claim 11, comprising:
providing metal wiring electrically connected to the terminal on a flat surface of a hardened adhesive layer where the carrier film is separated and exposed after the base adhesive layer is formed to the hardened adhesive layer in a solid; and
providing a protection layer to cover the metal wiring on the first surface of the element.

15. An element transferring method comprising:
preparing a carrier film in which a first surface of an element on which a terminal is formed is adhered to an adhesive surface;
providing a cover adhesive layer on the adhesive surface so that a second surface of the element that is opposite to the first surface and where the terminal is not formed is covered;
transferring the element to a target substrate by adhering the cover adhesive layer to the target substrate while the second surface is facing the target substrate;
separating the carrier film from the element;
providing metal wiring electrically connected to the terminal on a flat surface of a hardened adhesive layer where the carrier film is separated and exposed after the cover adhesive layer is formed into the hardened adhesive layer in a solid;
providing a protection layer to cover the metal wiring on the first surface of the element; and
after providing the protection layer, separating the target substrate from the hardened adhesive layer and attaching a flexible substrate to the hardened adhesive layer,
wherein in transferring the element, the carrier film is pressed so that a surface of the cover adhesive layer is flat at the same height as the terminal.

16. The electronic panel manufacturing method of claim 15, wherein
the target substrate is separated from the hardened adhesive layer by a laser lift-off (LLO) method.

17. An element transferring method comprising:
preparing a carrier film in which a first surface of an element on which a terminal is formed is adhered to an adhesive surface;
providing a cover adhesive layer on the adhesive surface so that a second surface of the element that is opposite to the first surface and where the terminal is not formed is covered;
forming a base adhesive layer on one surface of a target substrate;
transferring the element to the base adhesive layer by attaching the cover adhesive layer to the base adhesive layer while the second surface faces the base adhesive layer:
separating the carrier film from the element;
providing metal wiring electrically connected to the terminal on a flat surface of a hardened adhesive layer where the carrier film is separated and exposed after the cover adhesive layer and the base adhesive layer are formed into the hardened adhesive layer in a solid;
providing a protection layer to cover the metal wiring on the first surface of the element; and
after providing the protection layer, separating the target substrate from the hardened adhesive layer and attaching a flexible substrate to the hardened adhesive layer,
wherein in transferring the element, the carrier film is pressed so that a surface of the cover adhesive layer is flat at the same height as the terminal.

18. An element transferring method comprising:
preparing a carrier film in which a first surface of an element on which a terminal is formed is adhered to an adhesive surface;
weakening an adhesive force between the element and the adhesive surface;
forming a base adhesive layer on one surface of a target substrate;
transferring the element to the base adhesive layer by adhering the adhesive surface to the base adhesive layer in a state that a second surface of the element, which is opposite to the first surface and where the terminal is not formed, faces the base adhesive layer;
separating the carrier film from the element;
providing metal wiring electrically connected to the terminal on a flat surface of a hardened adhesive layer where the carrier film is separated and exposed after the base adhesive layer is formed to the hardened adhesive layer in a solid;
providing a protection layer to cover the metal wiring on the first surface of the element; and after providing the protection layer, separating the target substrate from the hardened adhesive layer and attaching a flexible substrate to the hardened adhesive layer,
wherein in transferring the element, the carrier film is pressed so that a surface of the base adhesive layer is flat at the same height as the terminal.

\* \* \* \* \*